United States Patent
Sakamoto

(10) Patent No.: US 6,836,237 B2
(45) Date of Patent: Dec. 28, 2004

(54) ANALOG-TO-DIGITAL CONVERTER

(75) Inventor: Tadayuki Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/806,457

(22) Filed: Mar. 23, 2004

(65) Prior Publication Data
US 2004/0189505 A1 Sep. 30, 2004

(30) Foreign Application Priority Data

Mar. 25, 2003 (JP) .................................. P.2003-082548

(51) Int. Cl.[7] .............................................. H03M 1/12
(52) U.S. Cl. ...................... 341/156; 341/158; 341/159
(58) Field of Search ................................. 341/155–156, 341/158–159

(56) References Cited

U.S. PATENT DOCUMENTS 4,745,393 A * 5/1988 Tsukada et al. ............. 341/136
5,099,240 A * 3/1992 Nakatani et al. ............ 341/156
5,194,866 A * 3/1993 Imaizumi et al. ........... 341/156
5,534,864 A * 7/1996 Ono et al. ................... 341/156
5,923,277 A * 7/1999 Takeda ....................... 341/156
6,014,097 A * 1/2000 Brandt ........................ 341/156

FOREIGN PATENT DOCUMENTS

JP       6-81048 B     10/1994

* cited by examiner

Primary Examiner—Brian Young
Assistant Examiner—Khai Nguyen
(74) Attorney, Agent, or Firm—Morgan, Lewis & Bockius LLP

(57) ABSTRACT

In a converter which operates in a serial-parallel manner and performs analog-to-digital (A/D) conversion, the number of high bits is made more than half the entire number of bits, with the number of low bits is given by half the entire number of bits, thereby acquiring high-bit and low-bit data. When no match exists between the high-bit data and the low-bit data, the high-bit data can be modified by means of the low-bit data.

3 Claims, 3 Drawing Sheets

ANALOG-TO-DIGITAL CONVERTER

BACKGROUND OF THE INVENTION

1. Field of the Invention

The present invention relates to an analog-to-digital (A/D) converter, and more particularly, to a serial-parallel A/D converter suitable for use with realization of an integrated circuit.

2. Description of the Related Art

Comparing to the case of a parallel A/D converter whose circuit scale is increased exponentially in accordance with the number of bits, the circuit configuration of a serial-parallel A/D converter can be simplified, and the serial-parallel A/D converter is more suitable for an integrated circuit fabrication.

In the serial-parallel A/D converter such as shown in FIG. 3, when four-bits resolution is adopted for example, three comparators 1 in use of the high bits compares an input voltage Vin with each of the partial voltages of a reference voltage $V_{REF}$, being divided by resistances, to determine the higher two bits $D_U$ by way of an encoding circuit 2. Further, a certain switch is selected from a group of switches 3 to 6 on the basis of the result of determination so as to compare the input voltage with each of the selected reference partial voltages by three comparators 7 in use of the low bits, by activating said selected switch. Thus, two lower bits $D_L$ are determined by way of an encoding circuit 8.

In general, an A/D converter for 2n bits determines higher "n" bits through use of $2^n-1$ comparators, and lower "n" bits through use of other $2^n-1$ comparators. Therefore, a required number of comparators is $2^{n+1}-2$. When compared with the number of comparators required by a complete parallel A/D converter; that is, $2^{2n}-1$, the required number of comparators can be considerably reduced.

The serial-parallel A/D converter employs different groups of comparators to determine high-bit data and low-bit data and causes the comparators to perform comparing operations at different timings. Hence, an operational error (a mismatch) due to a difference in circuit configurations or the like may happen in comparing operations in-between.

In order to prevent occurrence of such a operational error in comparing operations, such as can be seen during conversion of high bits and low bits, the following practice is known to be adopted such as disclosed in Japanese patent publication Hei 06-81048. That is, in a case where 2n bits are subjected to A/D conversion and if the high bits are given as "n" bits (e.g., two bits) at the time of A/D conversion of 2n bits (e.g., four bits), the numbers of the comparators to be used for converting the low bits are increased (e.g., from three comparators to seven comparators) so that the range of reference partial voltages to be compared is vertically expanded with giving the low bits as n+1 bits (e.g., three bits). In this way, the operational error can be compensated.

In said low-bit comparator, since an error range allowed for determining a least significant bit (LSB) becomes narrow, the low-bit comparator must be structured more accurately than that of the high-bit comparator. Consequently, the amount of electric current consumption by the comparator becomes larger, and a large area is also required even if many efforts were made in a circuit design.

As mentioned above, in order to prevent occurrence of a operational error in comparing operation during conversion of high and low bits, the conventional serial-parallel A/D converter shall be provided with the additional high-precision low-bit comparators. Therefore, there arises a problem of an increase in the amount of electric current consumption by the serial-parallel A/D converter itself as well as a problem of increase in the required area for the IC chip.

SUMMARY OF THE INVENTION

Accordingly, the present invention aims for providing an analog-to-digital converter which performs serial-parallel operations in two steps to carry out A/D conversion so as to prevent occurrence of a operational error in comparing operations during conversion of high and low bits with lowering the amount of electric current consumption without increasing the number of the low-bit comparators which requires high-precision to be made.

According to the first aspect in this invention, an analog-to-digital converter for converting an input voltage into a plurality of digital signals through serial-parallel conversion is provided such that each of said plurality of digital signals is comprised of N bits data where N is an integer of not less than two, the converter comprising: a partial voltage generation circuit which generates a plurality of partial voltages for said N bits by means of dividing a reference voltage; high-bits side comparators for comparing said input voltage with each partial voltage, said each partial voltage being in a part of said plurality of partial voltages, which becomes data of high bits whose bit number is more than half of the N bits; a high-bits side encoding circuit which encodes comparison results from said high-order comparators and outputs said encoded comparison results as high-bit data having said bit number of said high bits; selection circuits for selecting a part of said partial voltages, which becomes data of low bits with a bit number being defined as half of the plurality of said N bits, in accordance with said comparison results of said high-bits side comparators;

low-bits side comparators for comparing each partial voltage of said partial voltages selected by said selection circuits with said input voltage; a low-bits side encoding circuit which encodes comparison outputs from said low-bits side comparators and outputs said encoded comparison results as low-bit data having said bit number of said low bits; and a logic circuit which outputs N bits data based on a matching being made between the high-bit data and the low-bit data, wherein when said matching stands between the high-bit data and the low-bit data, said N bits data is output in accordance with predetermined conditions, while when said matching does not stands in-between, said high-bit data is modified according to said low-bit data, and said N bits data is output in accordance with predetermined conditions.

According to the second aspect in this invention, it is characterized by said analog-to-digital converter where the N bits is defined by 2n bits, the high-bit data by n+1 bits, and the low-bit data by "n" bits.

According to the third aspect in this invention, it is characterized by the analog-to-digital converter, further comprising: a sample-and-hold circuit which samples and holds an input signal from the outside every sampling cycle to generate said input voltage; high-bits side latch circuits which latch comparison outputs from said high-bits side comparators and input said latched comparison outputs to said high-bits side encoding circuit; and low-bits side latch circuits which latch comparison outputs from said low-bits side comparators and input said latched comparison outputs to said low-bits side encoding circuit, wherein said high-bits side latch circuits and said low-bits side latch circuits perform latching operations at different timing within the same cycle of said sampling cycle.

DESCRIPTION OF THE PREFERRED EMBODIMENTS

Figure 1:
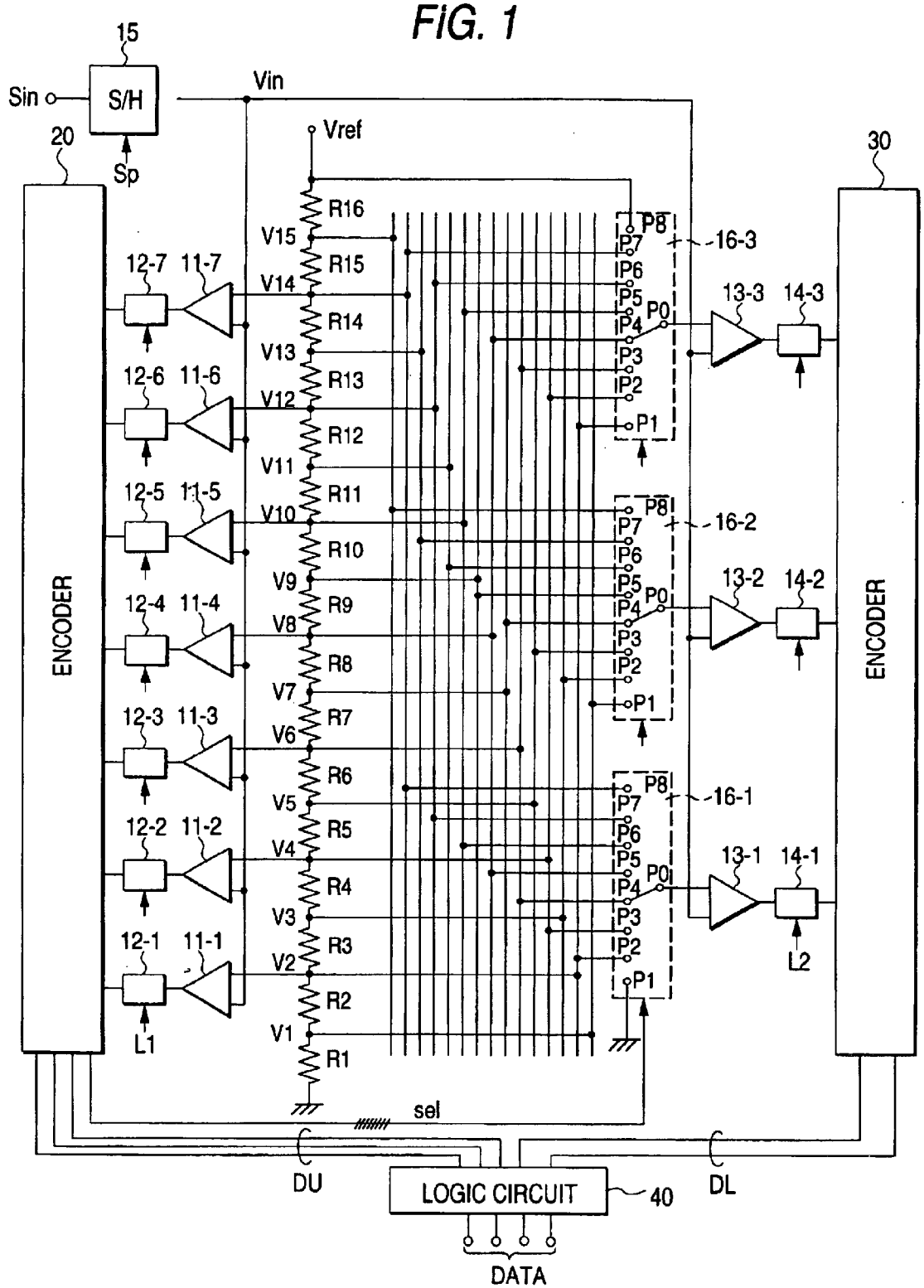
FIG. 1 is a view showing the configuration of a serial-parallel analog-to-digital (A/D) converter according to the invention.
Figure 2:
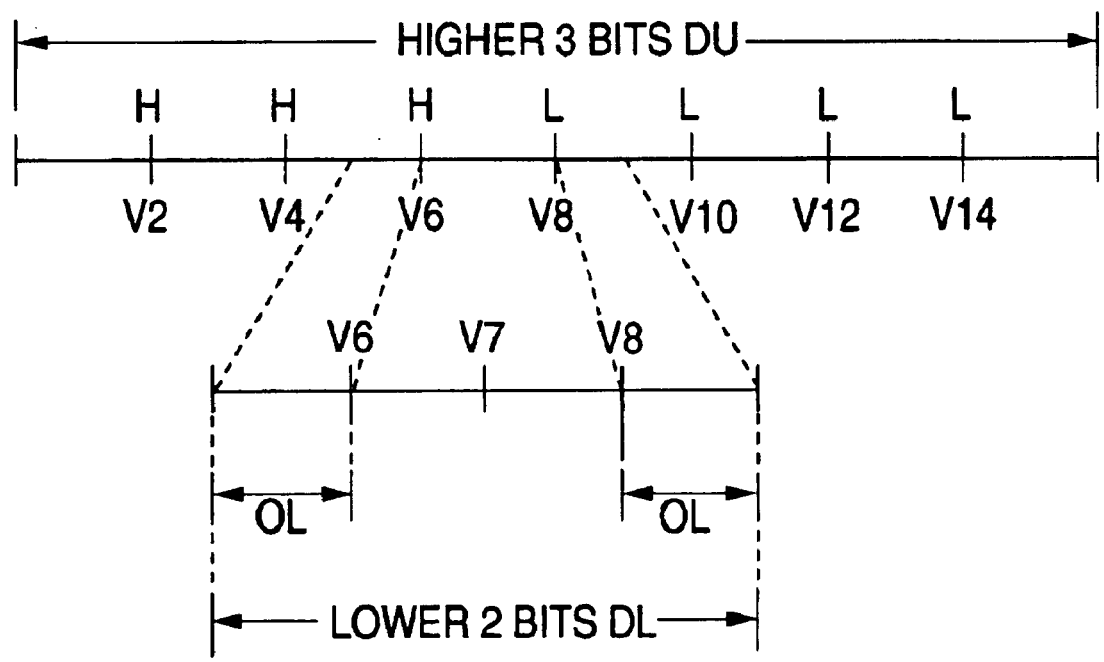
FIG. 2 is a view for describing operation of the serial-parallel A/D converter shown in FIG. 1.
Figure 3:
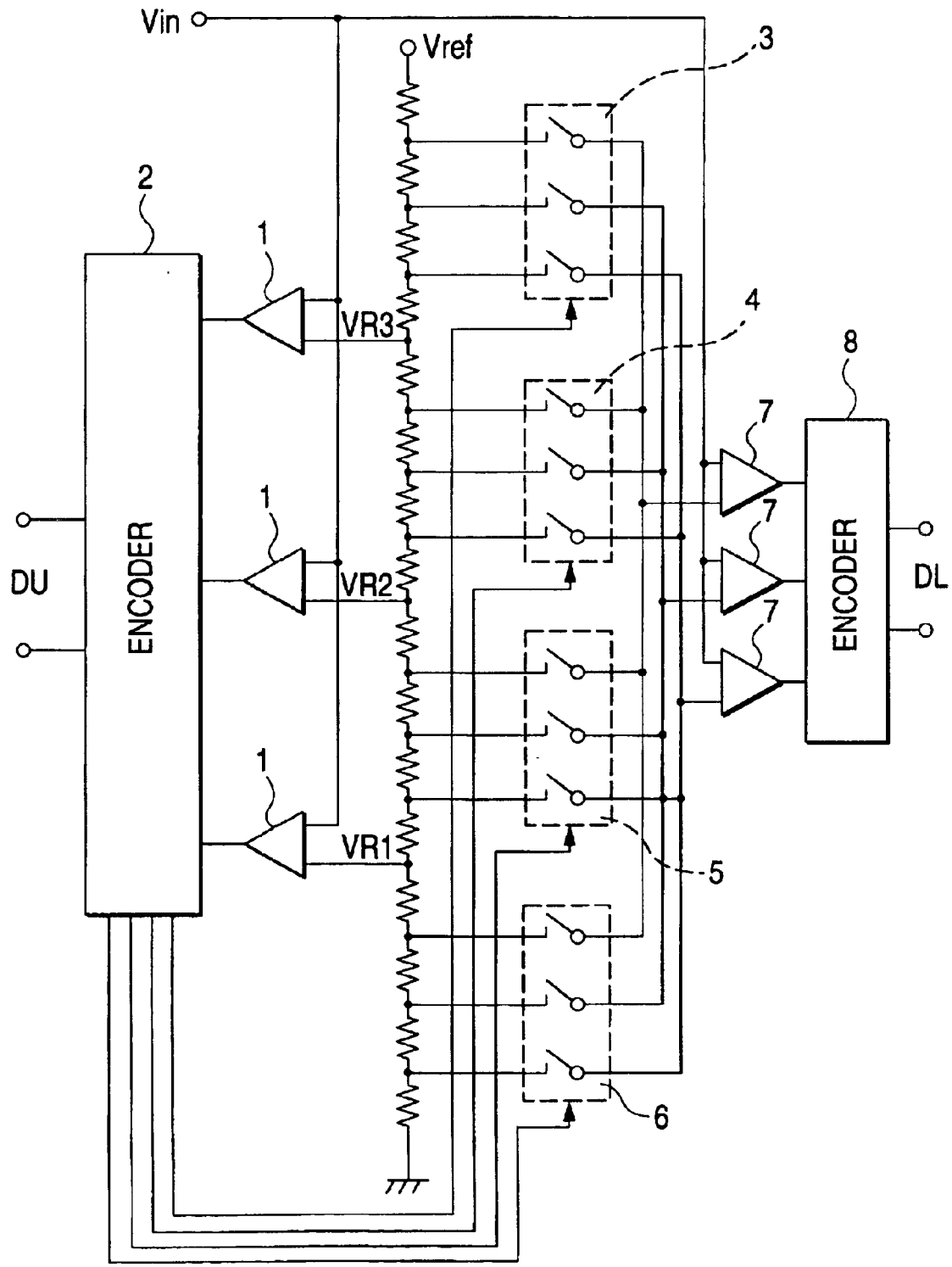
FIG. 3 is a view showing the configuration of a serial-parallel analog-to-digital (A/D) converter according to the related art.

An embodiment of a serial-parallel analog-to-digital (A/D) converter of the present invention which operates in two steps will be described hereinbelow by reference to the drawings. FIG. 1 is a view showing the configuration of a serial-parallel A/D converter according to an embodiment of the invention, and FIG. 2 is a view for describing operation of the serial-parallel A/D converter shown in FIG. 1.

FIG. 1 shows the configuration of the A/D converter which converts an input signal Sin into digital data Data whose number of bits N is four and outputs the thus-converted data Data. The A/D converter shown in FIG. 1 is fabricated into an IC chip.

In FIG. 1, a reference voltage Vref is divided between a reference voltage Vref line and a ground by means of resistors R1 to R16, having equal resistance values, whereby partial voltages V1 to V15 are obtained by way of respective partial voltage points.

A sample-hold circuit 15 samples the input signal Sin based on a sampling signal Sp of predetermined cycle. This sampled voltage value is given as an input voltage Vin and held during the period of a sampling cycle.

High-bits side comparators 11-1 to 11-7 compares the input voltage Vin with each of the partial voltages V2, V4, V6, V8, V10, V12, and V14 respectively, corresponding to higher most three bits from among four bits so that the partial voltages and the input voltage are compared in the states of the high/low level with each other. Turning back to the aforementioned related art, in the case of higher two bits, the input voltage Vin is compared with three partial voltages. In contrast with said related art, in the present invention, since the number of partial voltages to be compared at the high-bits side have been increased, the number of the high-bits side comparators as well as the latch circuits are increased accordingly.

As compared with low-order comparators 13-1, 13-2, and 13-3, the high-order comparators 11-1 to 11-7 have a larger allowable error margin. More specifically, concerning a certain high-bits side comparator as an example, it is allowable for said comparator to have an error margin between the reference voltage of said comparator and that of the upper provided comparator or the lower provided comparator. Therefore, in this regard, the high-bits side comparators are not required for so much high precision as compared with the lower-bits side comparator, thus electric power consumption can be lowered and the circuit design can be made possible in smaller area.

High-bits side latch circuits 12-1 to 12-7 may latch the comparison outputs that are produced by the high-bits side comparators 11-1 to 11-7 at a timing of a latch signal for high-bits side L1 being applied. The high-bits side latch signal L1 is produced once within each sampling cycle.

A high-bits side encoding circuit 20 receives latch outputs produced by the respective high-bits side latch circuits 12-1 to 12-7 and encodes the statuses of said outputs, thereby outputting three-bit high-bit data DU. The high-bits side encoding circuit 20 outputs a selection signal "sel" in accordance with statuses of the latch outputs from the high-bits side latch circuits 12-1 to 12-7. As shown in the drawing, the selection signal sel may be supplied over eight operating lines, otherwise the high-bit data DU might be utilized for producing it.

In accordance with the selection signal "sel", the first the second, and the third selection circuits 16-1 to 16-3 may select any one of eight input terminals P1 to P8 of which selected terminals are connected to the corresponding output terminals P0. The input terminals P1 to P8 of the selection circuit 16-1 receive the ground voltage and the partial voltages V2, V4, V6, V8, V10, V12, and V14. The input terminals P1 to P8 of the selection circuit 16-2 receive partial voltages V1, V3, V5, V7, V9, V11, V13, and V15. The input terminals P1 to P8 of the selection circuit 16-3 receive the partial voltages V2, V4, V6, V8, V10, V12, and V14 and the reference voltage Vref.

As for the partial voltages corresponding to the lower two bits of the four bits are selected by the selection circuits 16-1 to 16-3, and those selected partial voltages are input to the low-order comparators 13-1 to 13-3 respectively. Thereafter the partial voltages are compared with the input voltage Vin in connection with a low/high level. For instance, when the high-bits side comparators 11-1 to 11-3 output a high (H) level and the high-bits side comparators 11-4 to 11-7 output a low (L) level, the respective selection circuits 16-1 to 16-3 are each connected to the input terminal P4. Therefore, the low-order comparators 13-1 to 13-3 receive the partial voltages V6, V7, and V8.

The low-bits side comparators 13-1 to 13-3 determine the least significant bit LSB. Hence, the allowable error margin for those comparators are relatively narrow, on top of this, the highest possible precision might be required. Therefore, in this regard, the electric current consumption as well as the required area for the low-bits side comparators become larger than those needed for the high-bits side comparators. However, inasmuch as the number of low-bits side comparators can be reduced, the overall amount of electric current consumption as well as the required area for arranging the circuits can be also reduced accordingly.

Low-bits side latch circuits 14-1 to 14-3 may latch the comparison results from the low-bits side comparators 13-1, 13-2, and 13-3 respectively, at the timing of a low latch signal L2 being applied. The low latch signal L2 is produced only once within each sampling cycle after output of the selection signal sel and receiving of comparison outputs produced by the low-bits side comparators 13-1 to 13-3.

A low-bits side encoding circuit 30 receives latch outputs produced by the respective low-bits side latch circuits 14-1 to 14-3. Statuses of the latch outputs are coded, thereby outputting two-bit low-bit data DL.

A logic circuit 40 receives the 3-bit high-bit data DU and the two-bit low-bit data DL. When matching is being made between the high-bit data DU and the low-bit data DL, the signal "Data" shall be output as four-bit datain accordance with predetermined requirements. In contrast, if no matching exists between the high-bit data DU and the low-bit data DL, then the high-bit data DU shall be determined to be erroneous state and it shall be modified in accordance with the low-bit data DL so that the data shall be output as four-bit data "Data" in accordance with predetermined requirements.

Operation of the serial-parallel A/D converter that operates in two steps and is shown in FIG. 1 will now be described by further reference to FIG. 2.

The sample-and-hold circuit 15 samples and holds the input signal Sin at the timing of the sampling signal Sp being supplied so as to output the input voltage Vin.

The input voltage Vin is input to the high-bits side comparators 11-1 to 11-7 to be compared with the respective partial voltages V2, V4, V6, V8, V10, V12, and V14. In accordance with results of comparison, the high-bit data DU and the selection signal "sel" are thus determined.

The following description will be based on an example of the case where the high-bits side comparators 11-1 to 11-3 output an H level and the high-bits side comparators 11-4 to 11-7 output an L level. In this case, "011" is output as the high-bit data DU from the high-bits side encoding circuit 20. The selection signal "sel" is functioning as a trigger signal for the respective selection circuits 16-1 to 16-3 to select the input terminal P4.

As shown in FIG. 2, as a result of the selection circuits 16-1 to 16-3 having selected the input terminal P4 respectively, a partial voltage V6 is input to the low-bits side comparator 13-1, and a partial voltage V7 to the low-bits side comparator 13-2, and a partial voltage V8 to the low-bits side comparator 13-3 accordingly.

In this embodiment, four possible combinations of the comparison outputs from the low-bits side comparators 13-3 to 13-1 are contemplated such as expressed by "LLL," "LLH," "LHH," and "HHH." in descending order of the partial voltage.

The low-bits side encoding circuit 30 outputs two-bit as low-bit data DL in accordance with the combinations of the comparison outputs from the low-bits side comparators 13-3 to 13-1; for example, "00" for "LLL"; "01" for "LLH"; "10" for "LHH", and "11" for "HHH". Another expression might be also adopted for the low-bit data DL corresponding to the combinations of the comparison outputs, in accordance with the processing being performed by the logic circuit 40.

The three-bit high-bit data DU "011" output from the high-bits side encoding circuit 20 and the two-bit as the low-bit data DL output from the low-bits side encoding circuit 30 are input to the logic circuit 40. The logic circuit 40 determines whether or not matching can be made between the high-bit data DU and the low-bit data DL. If no match exists, the high-bit data DU might be modified in accordance with the low-bit data DL. The data might be then output as four-bit data in accordance with the predetermined conditions.

Determination as to whether or not the matching stands between the data DU and DL might be performed by the logic circuit 40 in the following manner. Since the output of the high-bits side comparator 11-4 is L-level, and that of the high-bits side comparator 11-3 is H-level, the combination of the comparison outputs from the low-bits side comparators 13-3 to 13-1 might be usually one of two combinations of "LLH," or "LHH."

When the combination of the comparison outputs from the low-bits side comparators 13-3 to 13-1 is "LLL" or "HHH", a mismatch might be considered between the comparison results of the high-bits side comparators 11-4, 11-3 and the comparison results of the low-bits side comparators 13-3 to 13-1. In other words, any matching can not stand between the high-bit data DU and the low-bit data DL.

In this case, the same partial voltage V8 is compared with the input voltage Vin through use of the high-bits side comparator 11-4 and the low-bits side comparator 13-3. Further, the same partial voltage V6 is compared with the input voltage Vin through use of the high-bits side comparator 11-3 and the low-bits side comparator 13-1. Since the low-bits side comparators 13-3, 13-1 are higher in accuracy than the high-bits side comparators 11-4, 11-3, the high-bit data DU are modified on the basis of the comparison results of the low-bits side comparators 13-3, 13-1, so that the output data Data is output.

As shown in FIG. 2, an overlap OL exists between evaluation of the high-bit data DU and evaluation of the low-bit data DL by one LSB in a direction of the lower voltage side from the partial voltage V6, and by one LSB in the opposite direction of a higher voltage side from the partial voltage V8. By making use of these overlaps OL, the high-bit data DL can be modified, thereby resolving the corresponding mismatches.

Table 1 shows the comparison results and statuses of modification of the high-bit data. Modified high bit are provided in parentheses.

TABLE 1

| HIGH-BIT DATA DU | LOW-BITS SIDE COMPARISON OUTPUT | LOW-BIT DATA DL | OUTPUT DATA Data |
|---|---|---|---|
| (1 0 0) | H H H | 1 1 | 1 0 0 0 |
| 0 1 1 | L H H | 1 0 | 0 1 1 1 |
| 0 1 1 | L L H | 0 1 | 0 1 1 0 |
| (0 1 0) | L L L | 0 0 | 0 1 0 1 |

The above description has been made for the case where the high-bits side comparators 11-1 to 11-3 output an H level and the high-bits side comparators 11-4 to 11-7 output an L level. However, even if the comparison results of the high-bits side comparators 11-1 to 11-7 are different ones, the same operations can be performed.

As mentioned above, according to the present invention, in the case of the four-bit A/D conversion, the number of the high-bits side comparators is seven, and the number of the low-bits side comparators is three. In the related art, the number of the high-bits side comparators is three, and the number of the low-bits side comparators is seven. Thus, the total number of comparators remains the same. However, the number of low-bits side comparators requiring high precision can be reduced. Therefore, the total amount of electric current consumption becomes lower, and the required area can be also made smaller.

The present invention is not limited to four-bit A/D conversion but can be applied to A/D conversion having an arbitrary number of bits N. In general expression, given that N=2n, the present invention can be embodied with $2^{n+1}-1$ high-bits side comparators and $2^n-1$ low-bits side comparators. When the number of bits N=8, the number of high-bits side comparators is 31, and the number of low-bits side comparators is 15. When the number of bits N is odd (e.g., 7), one is just added to the number of bits. The number of bits, which is half or more than half the bits N+1 with added one, should be given to the number of high bits (e.g. 5 or 4). As for the number of remaining bits, they should be taken as the number of low bits (e.g., 3 or 4).

According to the present invention, in an A/D converter which operates in a serial-parallel manner and performs A/D conversion, the number of high bits is made more than half the entire number of bits, while the number of low bits is just given by half the entire number of bits. If no match exists between high-bit data and low-bit data, the high-bit data can be modified through use of the low-bit data. By means of modification of the high-bit data, occurrence of a operational error can be prevented, which would otherwise arise during comparison operations performed for conversion between high bits and low bits. Furthermore, the amount of electric current consumption by the entire converter can be significantly reduced as compared with those for a related-art converter. Still further, increase of the area required for fabricating an IC chip can be suppressed.

What is claimed is:

1. An analog-to-digital converter for converting an input voltage into a plurality of digital signals, through serial-parallel conversion, each of said plurality of digital signals being comprised of N bits data where N is an integer of not less than two, the converter comprising:

a partial voltage generation circuit which generates a plurality of partial voltages for said N bits by means of dividing a reference voltage;

high-bits side comparators for comparing said input voltage with each partial voltage, said each partial voltage being in a part of said plurality of partial voltages, which becomes data of high bits whose bit number is more than half of the N bits;

a high-bits side encoding circuit which encodes comparison results from said high-order comparators and outputs said encoded comparison results as high-bit data having said bit number of said high bits;

selection circuits for selecting a part of said partial voltages, which becomes data of low bits with a bit number being defined as half of the plurality of said N bits, in accordance with said comparison results of said high-bits side comparators;

low-bits side comparators for comparing each partial voltage of said partial voltages selected by said selection circuits with said input voltage;

a low-bits side encoding circuit which encodes comparison outputs from said low-bits side comparators and outputs said encoded comparison results as low-bit data having said bit number of said low bits; and a logic circuit which outputs N bits data based on a matching being made between the high-bit data and the low-bit data, wherein when said matching stands between the high-bit data and the low-bit data, said N bits data is output in accordance with predetermined conditions, while when said matching does not stands in-between, said high-bit data is modified according to said low-bit data, and said N bits data is output in accordance with predetermined conditions.

2. The analog-to-digital converter according to claim 1, wherein said N bits data is defined by 2n bits, where said high-bit data is defined by n+1 bits, and said low-bit data is defined by "n" bits.

3. The analog-to-digital converter according to claim 1 or 2, further comprising:

a sample-and-hold circuit which samples and holds an input signal from the outside every sampling cycle to generate said input voltage;

high-bits side latch circuits which latch comparison outputs from said high-bits side comparators and input said latched comparison outputs to said high-bits side encoding circuit; and low-bits side latch circuits which latch comparison outputs from said low-bits side comparators and input said latched comparison outputs to said low-bits side encoding circuit, wherein said high-bits side latch circuits and said low-bits side latch circuits perform latching operations at different timing within the same cycle of said sampling cycle.

* * * * *